(12) United States Patent
Parekh

(10) Patent No.: US 7,006,392 B2
(45) Date of Patent: Feb. 28, 2006

(54) MEMORY REDUNDANCY PROGRAMMING

(75) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/764,954

(22) Filed: Jan. 26, 2004

(65) Prior Publication Data

US 2005/0162963 A1 Jul. 28, 2005

(51) Int. Cl.
  *G11C 7/00* (2006.01)
(52) U.S. Cl. .................... 365/200; 365/201; 365/225.7
(58) Field of Classification Search .......... 365/185.09, 365/200, 201, 225.7
  See application file for complete search history.

(56) References Cited

U.S. PATENT DOCUMENTS 5,442,589 A * 8/1995 Kowalski ................. 365/225.7
5,901,082 A * 5/1999 Chen et al. ............ 365/185.09
2004/0208071 A1 * 10/2004 Mukunoki et al. .......... 365/201

FOREIGN PATENT DOCUMENTS

EP     0 194 090   * 9/1986
JP     5-28787     * 2/1993

* cited by examiner

*Primary Examiner*—Tan T. Nguyen
(74) *Attorney, Agent, or Firm*—Williams, Morgan & Amerson, P.C.

(57) ABSTRACT

A method and apparatus is provided for performing a redundancy programming. The system of the present invention includes a device testing unit for performing a memory test. The system also includes a memory device operatively coupled to the device testing unit. The memory device includes an access transistor that includes a charge trapping area. A threshold voltage of the access transistor is modified upon trapping of charges in the charge trapping unit. The memory device also includes a memory element and a fuse associated with the memory element. The fuse is capable of entering an alternative state in response to modifying the threshold voltage of the access transistor. The state of the fuse may be used to program or de-program the memory element.

45 Claims, 6 Drawing Sheets

US 7,006,392 B2

MEMORY REDUNDANCY PROGRAMMING

BACKGROUND OF THE INVENTION

1. Field of the Invention

This invention relates generally to a semiconductor memory device, and, more specifically, to programming redundancy in memory devices.

2. Description of the Related Art

Modern integrated circuit devices are comprised of millions of semiconductor devices, e.g., transistors, formed above a semiconductor substrate, such as silicon. These devices are very densely packed, i.e., there is little space between them. Similarly densely packed electrically conducting lines may also be formed in the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

The semiconductor memory may be a dynamic random access memory, a flash memory, and the like. The semiconductor memory typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets, of the complete collection of memory cells. For example, a semiconductor memory having 16 megabits ($2^{24}$ bits) of storage capacity may be divided into 64 sub-arrays, each having 256K ($2^{18}$) memory cells.

When manufacturing memory devices, several testing and quality control procedures are performed to insure that a minimum standard of quality of the memory product is present upon completion of manufacturing. Generally, manufacturers are not capable of producing memory devices that are completely defect free or failure free. In order to achieve a predetermined yield, an ability to perform testing, which includes programming in or, programming out various elements of a memory device, is desirable. For example, faulty elements in memory devices may be programmed "out" and other redundant elements may be programmed "in" during the manufacturing of a memory device. This practice of redundancy may be used to reduce the amount of faults in a memory device.

Generally, state of the art, technology calls for implementing two types of redundancy corrections; fuse based programming and anti-fuse based programming. In the state of the art, some manufacturers employ a laser programmable fuse where a metal or a polysilicon link is used. Generally, a laser may be driven within a specific location to eradicate a location in memory; thereby implementing the blowing of a fuse using laser energy. This process forms a discontinuity in the conductor associated with that particular memory element. Subsequently, a sense circuitry may be able to sense an open circuit versus a conductive path, which provides the testing device 310 with an indication that a particular memory element has been eliminated. Thus, the faulty element is eliminated from the memory device.

State of the art memory programming methods may also include providing a large amount of current to blow a fuse causing a discontinuity; thereby eliminating a particular element from the memory device. Among the problems associated with implementing such redundancy programming may include the fact that a laser implementation requires a line of sight to invoke the laser energy; thereby the time that the redundancy programming may take place is limited. If a memory device is packaged then the laser implementation would not be possible. Additionally, in the large current method, large amounts of currents are required to provide controlled blowing of fuses, which may cause inefficiencies during manufacturing.

Manufacturers have also implemented anti-fuse programming of memory, where a connection to an element in the memory device is enabled by causing an existing open circuit to become electrically short. Many times, a pulsing current may be sent to an open circuit to actually cause a particular memory element to short, thereby invoking conduction through that particular element and programming it. In order to sense the result of this programming event, a high resistance and a low resistance detection is performed in order to determine whether a particular element in the memory device has been programmed. The anti-fuse method may also result in various inefficiencies in the manufacturing or memory devices, including problems created by the current pulse, and inefficiencies in detecting the programming.

The present invention is directed to overcoming, or at least reducing, the effects of, one or more of the problems set forth above.

SUMMARY OF THE INVENTION

In one aspect of the instant invention, a device is provided for performing a redundancy programming. The device of the present invention includes an access transistor that includes a charge trapping area. A threshold voltage of the access transistor is modified upon trapping of charges in the charge trapping unit. The device also includes a memory element and a fuse associated with the memory element. The fuse is capable of entering an alternative state in response to modifying the threshold voltage of the access transistor. The state of the fuse may be used to program or de-program the memory element.

In another aspect of the instant invention, a circuit is provided for performing a redundancy programming. The circuit of the present invention includes an access transistor that includes a charge trapping area. A threshold voltage of the access transistor is modified upon trapping of charges in the charge trapping unit. The circuit also includes a memory element and a fuse associated with the memory element. The fuse is capable of entering an alternative state in response to modifying the threshold voltage of the access transistor. The state of the fuse may be used to program or de-program the memory element.

In another aspect of the instant invention, a system board is provided for performing a redundancy programming. The system board of the present invention includes a controller for performing a memory operation. The system board also includes a memory device operatively coupled to the controller. The memory device is capable of providing memory access to the controller. The memory device includes an access transistor that includes a charge trapping area. A threshold voltage of the access transistor is modified upon trapping of charges in the charge trapping unit. The memory device also includes a memory element and a fuse associated with the memory element. The fuse is capable of entering an alternative state in response to modifying the threshold voltage of the access transistor. The state of the fuse may be used to program or de-program the memory element.

In yet another aspect of the instant invention, a system is provided for performing a redundancy programming. The system of the present invention includes a device testing unit for performing a memory test. The system also includes a memory device operatively coupled to the device testing unit. The memory device includes an access transistor that includes a charge trapping area. A threshold voltage of the access transistor is modified upon trapping of charges in the charge trapping unit. The memory device also includes a memory element and a fuse associated with the memory element. The fuse is capable of entering an alternative state in response to modifying the threshold voltage of the access transistor. The state of the fuse may be used to program or de-program the memory element.

In another aspect of the instant invention, a method is provided for performing a redundancy programming. The method of the present invention includes programming a memory element in a memory device by controlling a threshold voltage associated with the memory device. Controlling the threshold voltage includes controlling the threshold voltage of an access transistor in the memory device by trapping charges in a charge trapping area of the access transistor. The threshold voltage of the access transistor is modified upon trapping of charges in the charge trapping unit. Programming the memory element also includes activating a fuse coupled to the memory element in response to changing the threshold voltage, for activating the memory element.

BRIEF DESCRIPTION OF THE DRAWINGS

The invention may be understood by reference to the following description taken in conjunction with the accompanying drawings, in which like reference numerals identify like elements, and in which.

Figure 1:
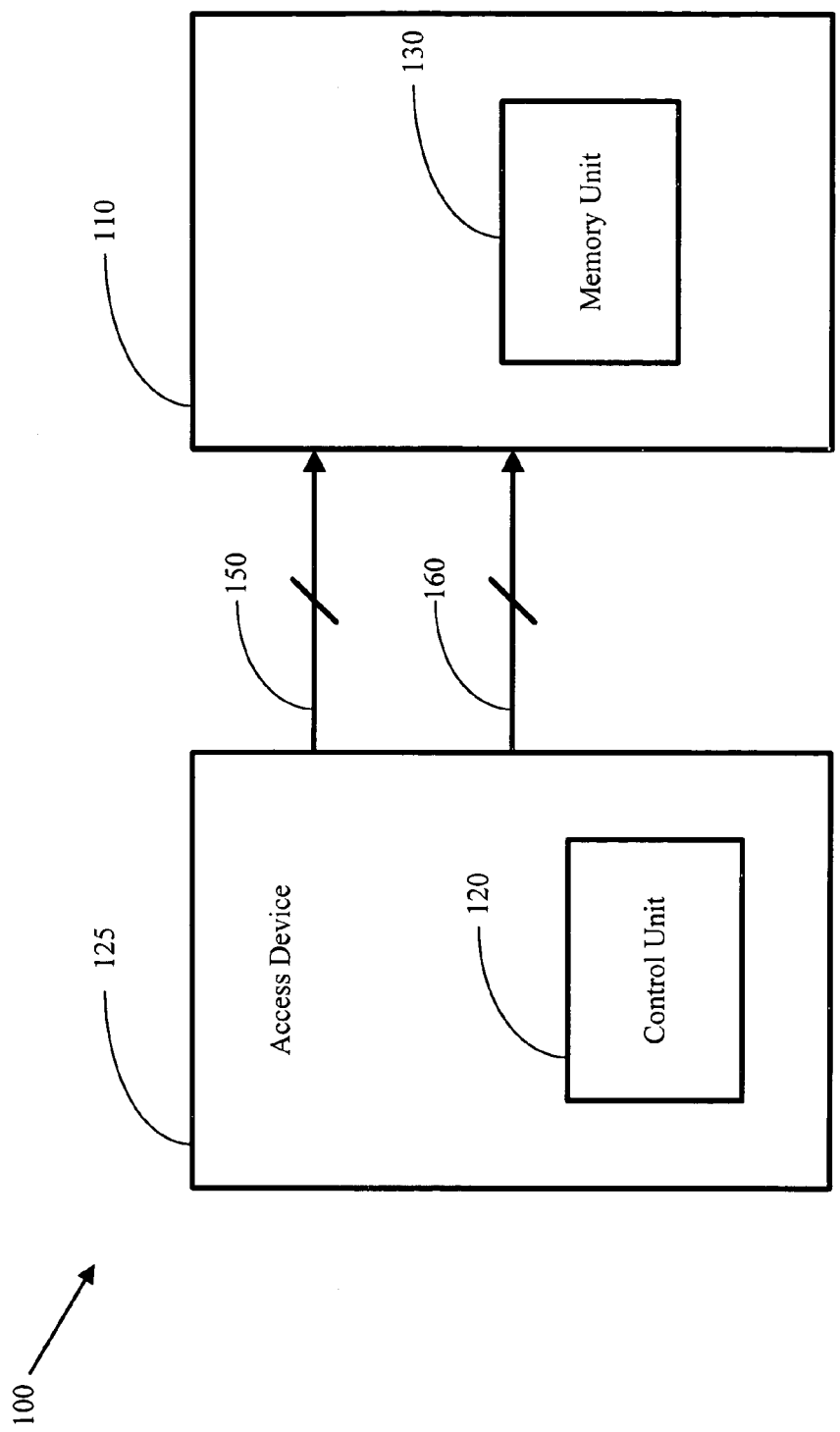
FIG. 1 is a block diagram of a system including a device that is capable of accessing digital signals, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Embodiments of the present invention provide for implementing a redundancy programming utilizing an electron charge trapping technique to program a particular element of a memory device into an active state or to de-program a memory element into an inactive state. The present invention provides for using hot electron charge trapping on a device (e.g., a transistor) in order to program it as a fused or a non-fused element. Among the various advantages provided by implementing the present invention includes the fact that standard memory access device type layout and type structures may be used to implement the redundancy programming provided by the present invention. The present invention provides for shifting the threshold voltage ($V_t$) of the programming device. The change in the threshold voltage may be sensed to determine whether a particular element in the memory device has been programmed. In many manufacturing process areas, charge trapping is a phenomenon that is avoided by implementing various implants into the memory device. The present invention calls for removing particular masks during processing of semiconductor wafers in order to block certain areas where a charge trapping mechanism is provided; thereby providing the ability to use the charge trapping for programming various elements of the memory device.

Referring to FIG. 1, a block diagram of a system 100 is illustrated, in accordance with one embodiment of the present invention. The system 100 comprises a first device 110, which, in one embodiment, may comprise a memory unit 130 capable of storing data. In one embodiment, the memory unit 130 may be a dynamic random access memory (DRAM), a static random access memory (SRAM), a pseudo-static static random access memory (PSRAM), a double-data rate synchronous DRAM (DDR SDRAM, DDR I, DDR II), a Rambus™ DRAM (RDRAM), a FLASH memory unit, or the like. The first device 110 may be accessed by a second device 125, which, in one embodiment, may be an accessing/access device. The second device 125 may send addresses on a line 150 to the first device 110. The first device 110 may then provide data to the second device 125 on a line 160. The first and second devices 110, 125 may comprise a control unit 120 capable of accessing data (including code) stored in the memory unit 130 of the first device 110. The second device 125 may be any device that uses the first device 110 to store data, read data, or both. Examples of the second device 125 may include, but are not limited to, a computer, a camera, a telephone, a television, a radio, a calculator, a personal digital assistant, a network switch, and the like.

The control unit 120, in one embodiment, may manage the overall operations of the second device 125, including writing and reading data to and from the first device 110. The control unit 120 may comprise a microprocessor, a microcontroller, a digital signal processor, a processor card (including one or more microprocessors or controllers), a memory controller, or other control or computing devices.

In one embodiment, the first device 110 may be a memory chip device, such as a DRAM device, an SRAM device, a FLASH memory device, and the like. In one embodiment, the first device 110 may be a memory chip device that may be implemented into a digital system, such as a computer system. In an alternative embodiment, the first device 110 may be an external memory, such as a memory stick, and may be accessed when inserted into a slot (not shown) of the second device 125. When inserted into the slot, the second device 125 may provide the appropriate power and control signals to access memory locations in the first device 110. The first device 110 may be external to, or internal (e.g., integrated) to, the second device 125. The second device 125, which may be a computer system, may employ a first device 110 (in the form of a memory unit) that is integrated within the computer system to store data (e.g., BIOS [basic input/output system]) related to the computer system.

Figure 2:
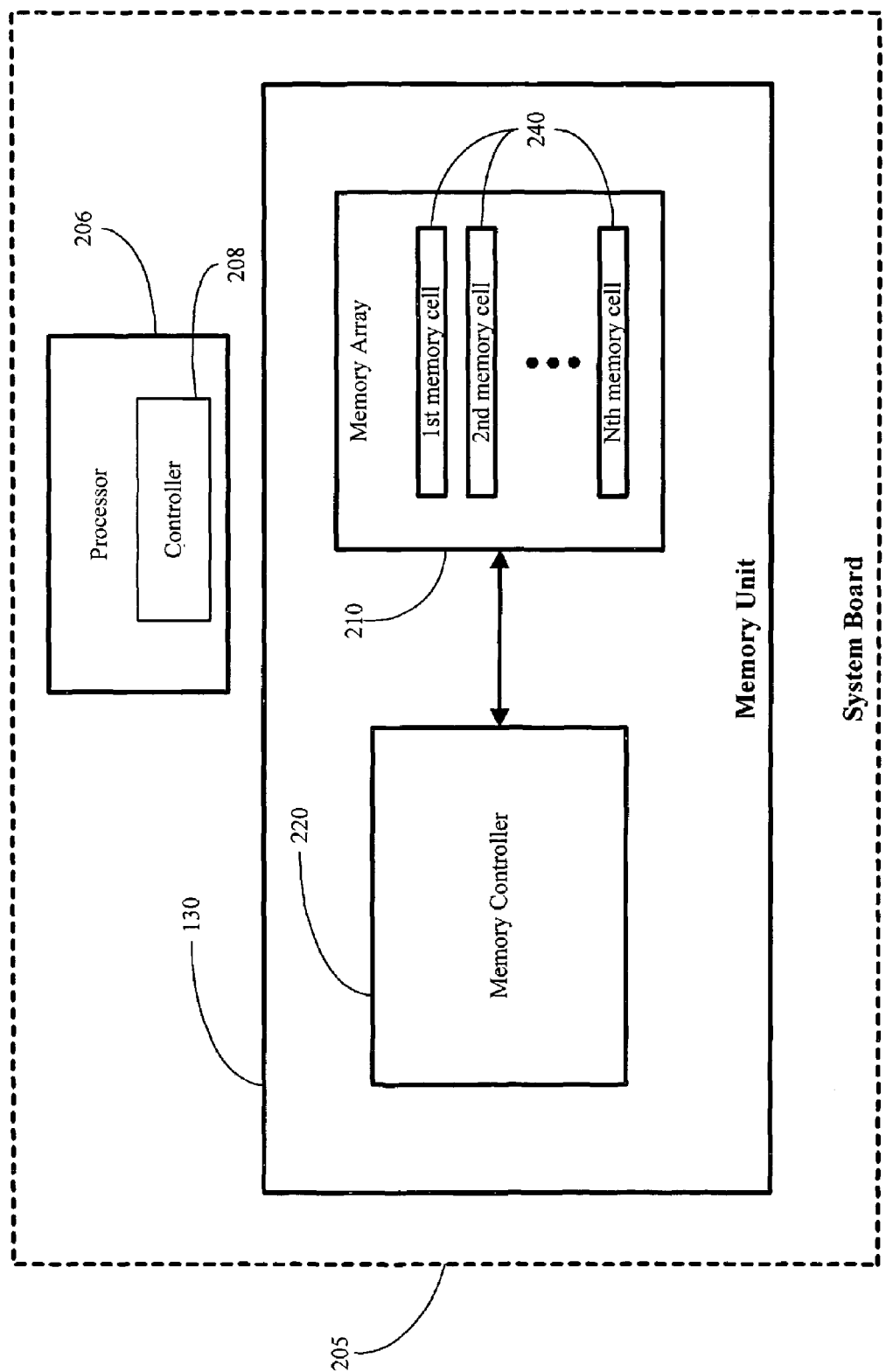
FIG. 2 is a more detailed block diagram representation of the memory unit of FIG. 1, in accordance with one illustrative embodiment of the present invention.

Turning now to FIG. 2, a more detailed block diagram depiction of the memory unit 130 in a system board 205, in accordance with one illustrative embodiment of the present invention, is provided. In one embodiment, the memory unit 130 comprises a memory controller 220, which is operatively coupled to one or more memory arrays 210. The memory controller 220 may comprise circuitry that provides access (e.g., such as storing and extracting data to and from the memory arrays 210) to control operations of the memory unit 130. The memory array 210 may include an array of memory storing modules (e.g., memory cells 240) that are capable of storing data. The memory unit 130 includes devices that allow for the charge-trapping techniques provided by embodiments of the present invention for programming various elements of the memory unit 130. The memory unit 130 may reside on the system board 205, such as a PC board or a motherboard. The system board 205 may also comprise a processor 206 that includes a controller 208 for controlling the operation of the memory unit 130.

Figure 3:
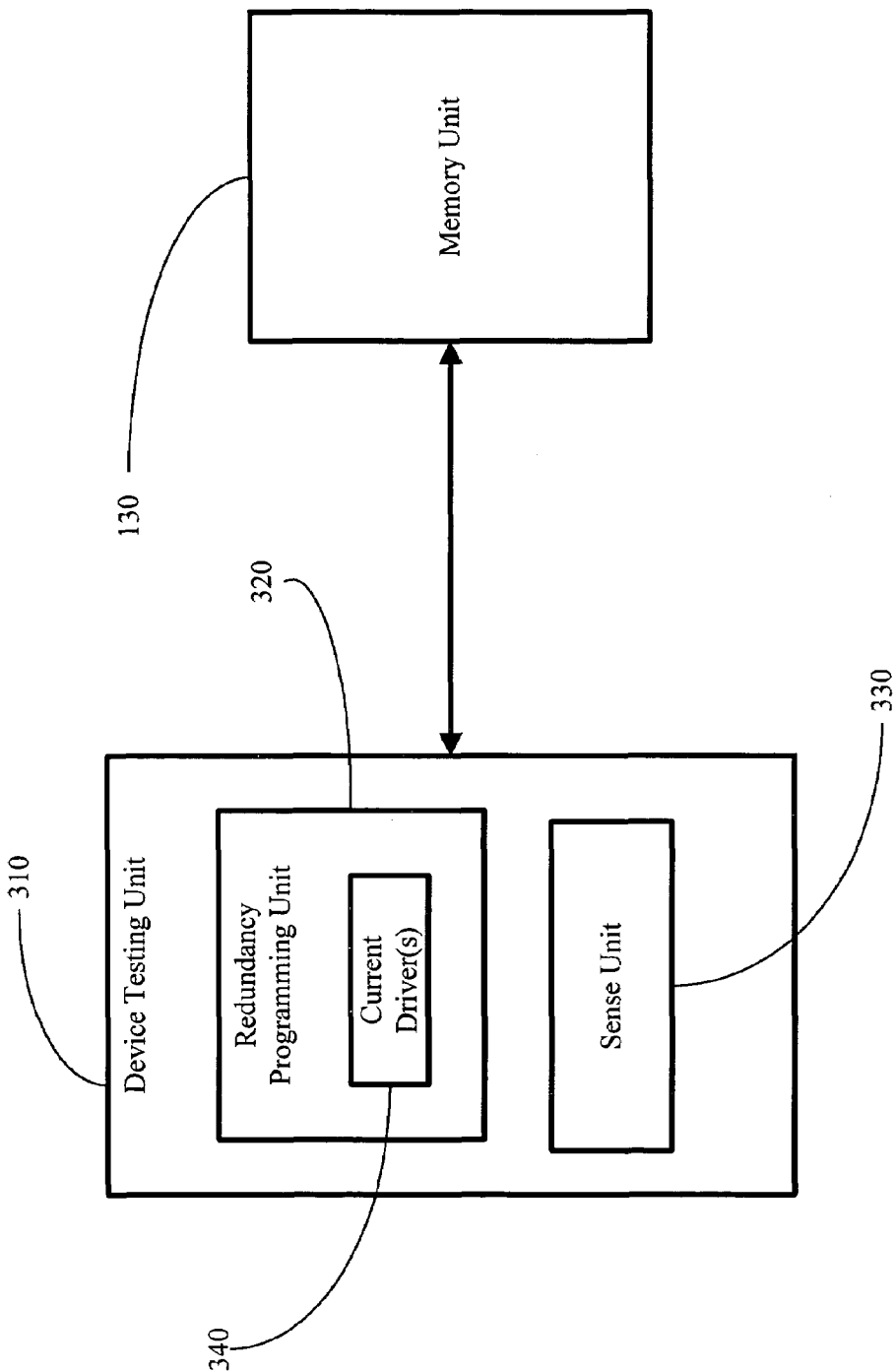
FIG. 3 illustrates a system for performing a redundancy programming of memory in accordance with one illustrative embodiment of the present invention.

Turning now to FIG. 3, a device testing unit 310 that is used to test various memory elements of the memory unit 130 is illustrated. A device testing unit 310 may sense various elements of the memory unit 130, which then may be used to program or de-program the elements in the memory unit 130. For example, defective memory elements or areas of the memory unit 130 may be de-programmed and replaced with redundant memory elements to provide an acceptable yield of memory units 130 being manufactured. In one embodiment, the device testing unit 310 may comprise various circuits that are capable of programming the various elements in the memory unit 130. The device testing unit 310 may comprise a redundancy programming unit 320, which is capable of programming or de-programming various elements in the memory unit 130. The redundancy programming unit 320 may comprise one or more current drivers 340 that are capable of driving various currents as determined by the device testing unit 310. The device testing unit 310 may also comprise a sense unit 330, which is capable of detecting the condition of a particular element. This data may then be used to determine whether a particular memory element has been programmed or de-programmed. The redundancy programming unit 320 receives data relating to the programming and de-programming of various memory elements. Using this data, device testing unit 310 may determine the status of various elements in the memory unit 130. The redundancy programming unit 320 is capable of utilizing the charge trapping approach provided by the present invention to program or de-program various memory elements of the memory unit 130. Implementing the present invention provides various advantages, such as not requiring high current to program various elements of the memory unit 130, thereby reducing the size of various circuits that are used to program the memory unit 130.

Additionally, a smaller drive and smaller sensors may be used to perform redundancy programming of the memory unit 130. Furthermore, the various elements of the memory unit 130 may also be reduced in size as a result of implementing the concepts provided by the present invention. Various embodiments of the present invention may be implemented using the existing structure of the wafers that are used to manufacture memory devices. Therefore, concepts of the present invention may be implemented requiring only a relatively few or no additional processing of the wafers when producing memory units 130.

Figure 4:
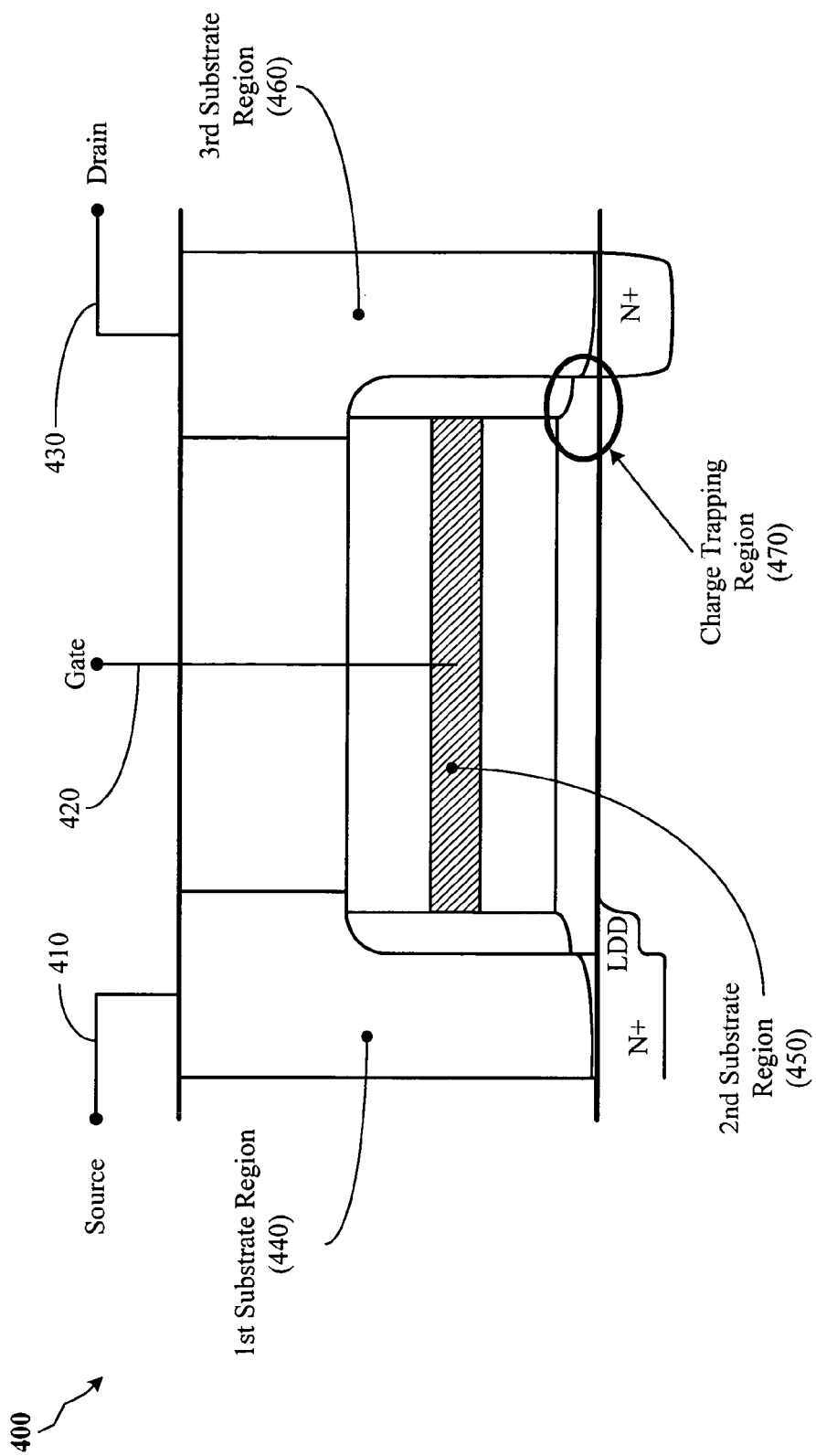
FIG. 4 depicts a stylized illustration of a cross-section of a transistor, in accordance with one illustrative embodiment of the present invention.

Turning now to FIG. 4, a stylized, cross-sectional diagram of a portion of a wafer used to manufacture a memory unit/device 130 is illustrated. More specifically, a cross-section of a particular transistor associated with a memory element of the memory unit 130 is illustrated. The transistor 400 illustrated in FIG. 4 comprises a source terminal 410, a gate terminal 420, and a drain terminal 430. The source terminal 410 is coupled to a first substrate region 440. The gate terminal 420 is coupled to a second substrate region 450. The drain terminal 430 is coupled to a third substrate region 460. FIG. 4 illustrates a charge trapped region 470, which provides for utilizing the charge trapping redundancy program provided by the present invention.

As illustrated in FIG. 4, the charge trapping region 470 lacks an LDD region, thereby providing for trapping charges under a spacer, which may be raised above the threshold voltage for the transistor 400. The programming method utilized by the present invention includes grounding the gate 420, a grounded source 410, and a grounded substrate 440, 450, 460; and providing high voltage on the drain node 430. This allows for a charge to be trapped into the charge trapping region 470 of the transistor 400, which may be the access transistor to a particular element in the memory unit 130. This charge trapping will generally result in a change in the threshold voltage of the transistor 400, thereby changing the active state or inactive state of a particular element in the memory unit 130.

Once the threshold voltage of the transistor 400 is changed, the device testing unit 310 may sense the change in the threshold voltage using the sense unit 330. In one embodiment, the sense unit 330 may comprise one or more sense amplifiers (not shown) capable of sensing a change in the threshold voltage. Therefore, a comparison may be made by the device testing unit 310 between non-programmed elements and programmed elements of the memory unit 130 to determine which elements of the memory unit 130 are programmed or not programmed. The programmed and non-programmed areas of the memory unit 130 will turn on at different times where one will have a low conduction and the other will have a higher conduction.

In one embodiment, the threshold voltage utilizing the charge trapping method described herein may be shifted by approximately 200 millivolts, but is not limited to such voltage. Therefore, a relatively reliable measurement can be made to determine whether a particular element in the memory unit 130 is programmed or non-programmed. In other words, the threshold voltage may be manipulated to actually program a particular element and then the threshold voltage may be used to determine whether such programming has been implemented.

Figure 5:
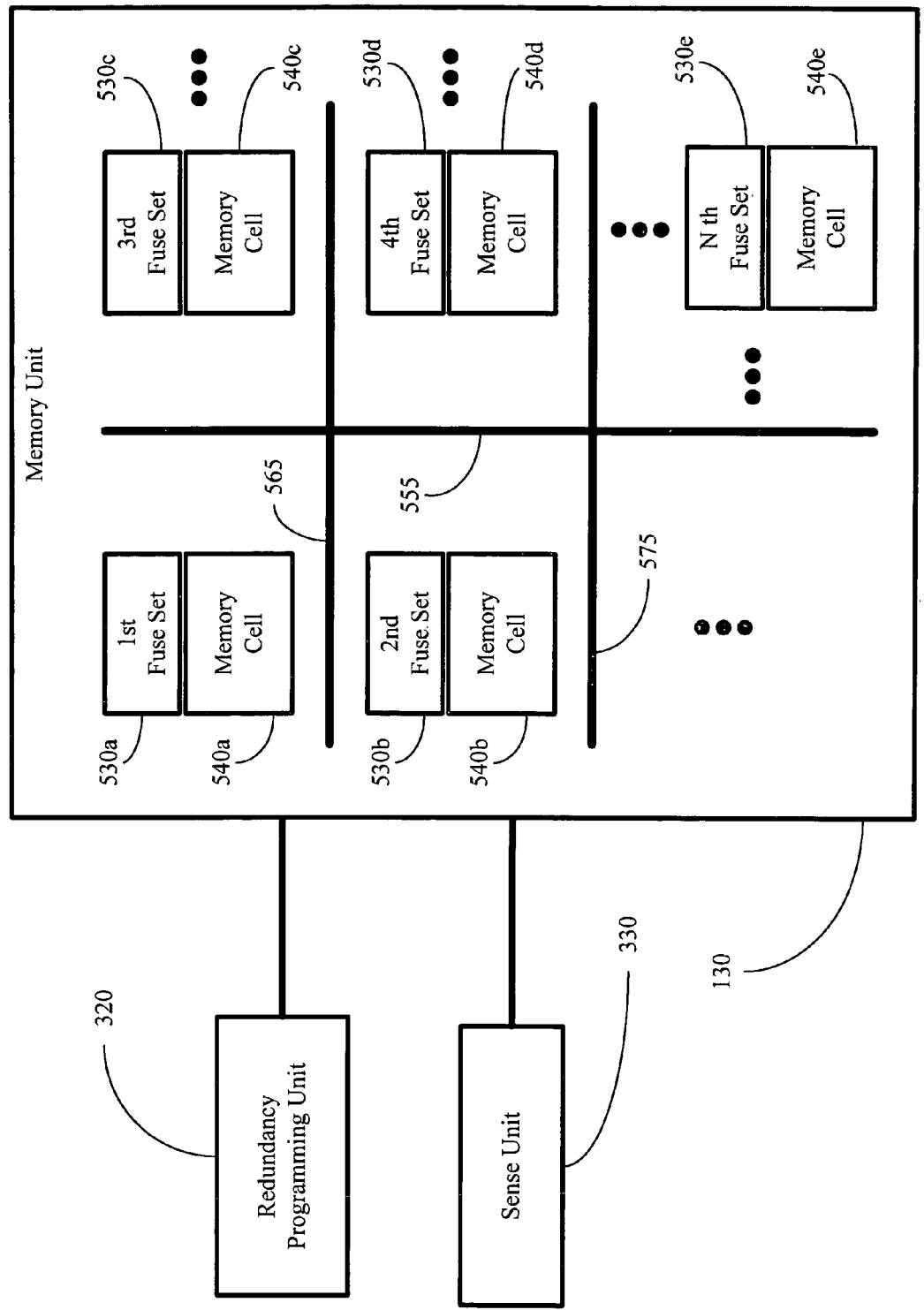
FIG. 5 illustrates a more detailed block diagram of the memory unit of FIGS. 1, 2, and 3, in accordance with one illustrative embodiment of the present invention.
Figure 6:
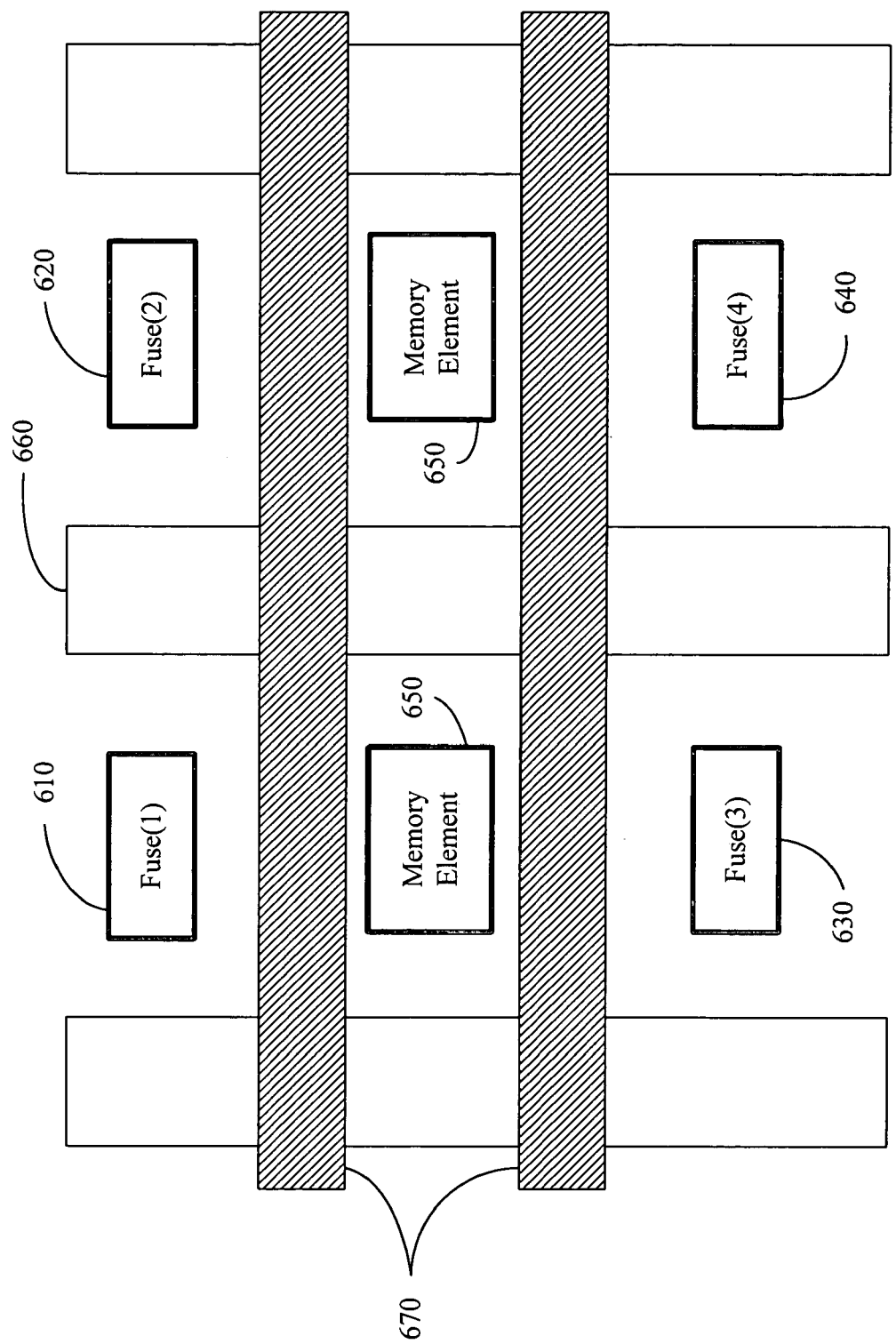
FIG. 6 illustrates a more detailed illustration of a fuse set associated with a memory cell of FIG. 5, in accordance with one illustrative embodiment of the present invention.

FIGS. 5 and 6 illustrate various implementations of the embodiments of the present invention. As shown in FIG. 5, one embodiment of the various elements of the memory unit 130 in accordance with one embodiment of the present invention is illustrated. As illustrated in FIG. 5, the memory unit 130 may comprise various memory cells that have accompanying fuse sets 530, which may be programmed "in" or "out". The memory unit 130 comprises a first fuse set 530a coupled to a memory cell 540a. The memory unit 130 also comprises a second fuse set 530b coupled to a memory cell 540b, a third fuse set 530c coupled to a memory cell 540c, a fourth fuse set 530d coupled to a memory cell 540d, and an Nth fuse set 530e coupled to a memory cell 540e. Additionally, various conductive lines may interconnect various portions of the memory cells, such as the lines 555, 565, 575.

In one embodiment, the line 555 may be coupled to a ground signal. The redundancy programming unit 320 is capable of affecting the status of the fuse sets 530, such that the memory cells 540 may be programmed in or out. For example, the redundancy programming unit 320 may modify the threshold voltage of a particular transistors associated with the memory cell 540a and the first fuse set 530a. A common tap on the line 555 may be formed, and depending on which gate of the particular transistor associated with the various elements is turned on, charge trapping may be performed on one side or the other side of the common tap. Additionally, the various lines, such as lines 565 and 575, may be used to read back the particular connections or disconnections made upon the various elements of the memory unit 130.

A memory element in the memory unit 130 may be programmed by grounding a gate terminal associated with the access transistor of a particular element and grounding a substrate of the transistor. A particular fuse, such as the first fuse set 530a, may be selected and the voltage of the fuse node may be ramped up to a higher voltage, such as 7 volts. Therefore, a particular element may be programmed or re-programmed. The read back of the status of that particular element may be performed by applying a voltage over the threshold voltage, such as 100 millivolts level over the threshold voltage to the gate of the accessed transistor. The change in the threshold voltage may be used to determine whether a particular element is active or inactive. Therefore, utilizing the charge trapping techniques provided herein, various elements, such as a second fuse set 530b and memory cell 540b, may be programmed "in" while other elements, such as the fourth fuse set 530d and memory cell 540d, are programmed "out". Hence, concepts provided by the present invention may be used to perform an efficient redundancy programming, such that various elements of the memory unit 130 may be programmed or de-programmed to eliminate various faulty elements and invoke other elements of the memory unit 130.

As shown in FIG. 6, one embodiment of implementing a fuse set and corresponding memory cell in accordance with embodiments of the present invention is illustrated. In one example, the memory cell may comprise memory elements 650, which may be surrounded by a fuse(1) 610, a fuse(2) 620, a fuse(3) 630, and a fuse(4) 640. A line 660 may be accessible by various portions of the memory cell and, in one embodiment, may be a ground connection. Various metal lines, such as line 670, may provide a read back path to the sense unit 330. The setup illustrated in FIG. 6 may provide a common tap that is formed and, depending on which gate is turned on, one side or the other side of the memory cell may be turned on. In other words, charge trapping upon one side or the other side of the memory cell may be performed when using the connections provided by the memory elements.

One of the fuses 610, 620, 630, 640 illustrated in FIG. 6 may be activated, such that an electrical path to a particular memory portion may be chosen. If the memory element 650 is then activated, various lines, such as lines 670 may be used to read back to verify such programming. Therefore, the setup illustrated in FIG. 6 may be used to program various memory cells in accordance with embodiments of the present invention. One of the fuses 610, 620, 630, 640 may be selected and a node of the fuse may be ramped up to a higher voltage, such as 7 volts. This method may be used to program a particular memory cell. Upon programming, a read back may be performed, for example, by applying a voltage, such as 100 millivolts over the threshold voltage to gate. The sense unit 330 may then sense, for example, at a common ground node, and compare with other points of the memory unit 130 to verify programming. Using these methods, various locations of the memory unit 130 may be programmed. Utilizing embodiments of the present invention, higher yields of memory devices may be realized. The teachings of the present invention may be implemented on a plurality of types of memory devices, such as flash memory, DRAM memory, and other volatile and/or non-volatile memory devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising:
   a transistor comprising a charge trapping area, wherein a threshold voltage of said transistor is modified upon trapping of charges in said charge trapping unit;
   a memory element; and
   a fuse associated with said memory element, said fuse to enter in an alternative state in response to modifying said threshold voltage of said transistor, thereby at least one of programming and de-programming said memory element.

2. The device of claim 1, wherein said device is a memory device.

3. The device of claim 2, wherein said memory device is at least one of a static random access memory (SRAM), a pseudo-static static random access memory (PSRAM), a dynamic random access memory (DRAM), a double-data rate SDRAM (DDR SDRAM), a DDR I device, a DDR II device, a Rambus DRAM (RDRAM), and a FLASH memory.

4. The device of claim 1, wherein said transistor is an N-channel device.

5. The device of claim 1, wherein said transistor is coupled to a plurality of conductive lines.

6. The device of claim 5, wherein at least one of said plurality of conductive lines is coupled to ground.

7. The device of claim 1, wherein at least one of said plurality of conductive lines is coupled to a programmable voltage.

8. The device of claim 1, wherein said threshold voltage is modified by an increase of about 100 millivolts.

9. The device of claim 1, wherein said threshold voltage is modified by an increase of about 200 millivolts.

10. The device of claim 1, wherein said transistor comprises an LDD region proximate a source region and a masked-off region proximate a drain region to prevent an LDD region proximate said drain region.

11. A circuit for performing a redundancy programming, comprising:
   an access transistor comprising a charge trapping area, wherein a threshold voltage of said access transistor is modified upon trapping of charges in said charge trapping unit;
   a memory element; and
   a fuse associated with said memory element, said fuse to become blown in response to modifying said threshold voltage of said access transistor, thereby de-programming said memory element.

12. The circuit of claim 11, wherein said access transistor is an N-channel device.

13. The circuit of claim 11, further comprising a plurality of conductive lines.

14. The circuit of claim 13, wherein at least one of said plurality of conductive lines is coupled to ground.

15. The circuit of claim 11, wherein at least one of said plurality of conductive lines is coupled to a programmable voltage.

16. The circuit of claim 11, wherein said access transistor comprises an LDD region proximate a source region and a masked-off region proximate a drain region to prevent an LDD region proximate said drain region.

17. A system board, comprising:
   a controller for performing a memory operation; and
   a memory device operatively coupled to said controller, said memory device to provide memory access to said controller, said memory device comprising:
      an access transistor comprising a charge trapping area, wherein a threshold voltage of said access transistor is modified upon trapping of charges in said charge trapping unit;
      a memory element; and
      a fuse associated with said memory element, said fuse to become blown in response to modifying said threshold voltage of said access transistor, thereby de-programming said memory element.

18. The system board of claim 17, wherein said memory device is at least one of a static random access memory (SRAM), a pseudo-static static random access memory (PSRAM), a dynamic random access memory (DRAM), a double-data rate SDRAM (DDR SDRAM), a DDR I device, a DDR II device, a Rambus DRAM (RDRAM), and a FLASH memory.

19. The system board of claim 18, wherein said access transistor is an N-channel device.

20. The system board of claim 18, wherein said access transistor is coupled to a plurality of conductive lines.

21. The system board of claim 20, wherein at least one of said plurality of conductive lines is coupled to ground.

22. The system board of claim 21, wherein at least one of said plurality of conductive lines is coupled to a programmable voltage.

23. The system board of claim 17, wherein said access transistor comprises an LDD region proximate a source region and a masked-off region proximate a drain region to prevent an LDD region proximate said drain region.

24. A system for performing a redundant memory programming, comprising:
   a device testing unit for performing a memory test;
   a memory device operatively coupled to said device testing unit, said memory device comprising:
      an access transistor comprising a charge trapping area, wherein a threshold voltage of said access transistor is modified upon trapping of charges in said charge trapping unit;
      a memory element; and
      a fuse associated with said memory element, said fuse to enter in an alternative state in response to modifying said threshold voltage of said access transistor by said device testing unit, thereby at least one of programming and de-programming said memory element.

25. The system of claim 24, wherein said device testing unit comprising:
   a redundant programming unit capable of modifying said threshold voltage for performing said redundant memory programming; and
   a sense unit capable of sensing the threshold voltage of said access transistor.

26. The system of claim 24, wherein said sense unit comprises at least one sense amplifier.

27. The system of claim 24, wherein said memory device is at least one of a static random access memory (SRAM), a pseudo-static static random access memory (PSRAM), a dynamic random access memory (DRAM), a double-data rate SDRAM (DDR SDRAM), a DDR I device, a DDR II device, a Rambus DRAM (RDRAM), and a FLASH memory.

28. The system of claim 24, wherein said access transistor is an N-channel device.

29. The system of claim 24, wherein said access transistor is coupled to a plurality of conductive lines.

30. The system of claim 29, wherein at least one of said plurality of conductive lines is coupled to ground.

31. The system of claim 24, wherein at least one of said plurality of conductive lines is coupled to a programmable voltage.

32. The system of claim 24, wherein said threshold voltage is modified by an increase of about 100 millivolts.

33. The system of claim 24, wherein said threshold voltage is modified by an increase of about 200 millivolts.

34. The system of claim 24, wherein said memory device comprises:
   a first fuse set comprising a plurality of fuses;
   a first memory cell associated with said first fuse set, wherein a charge trapping may be performed upon said memory cell based upon de-activation of at least one fuse in said first fuse set;
   a second fuse set comprising a plurality of fuses; and
   a second memory cell associated with said second fuse set, wherein a charge trapping may be performed upon said memory cell based upon de-activation of at least one fuse in said second fuse set.

35. The system of claim 34, wherein said first fuse set comprises four fuses that may be controlled for activating one of a plurality of memory elements associated with said first memory cell.

36. The system of claim 35, wherein said second fuse set comprises four fuses that may be controlled for activating one of a plurality of memory elements associated with said second memory cell.

37. The system of claim 24, wherein said access transistor comprises an LDD region proximate a source region and a masked-off region proximate a drain region to prevent an LDD region proximate said drain region.

38. A method, comprising:
   programming a memory element in a memory device by controlling a threshold voltage associated with said memory device, controlling said threshold voltage comprising controlling the threshold voltage of an access transistor by trapping charges in a charge trapping area of said access transistor, wherein a threshold voltage of said access transistor is modified upon trapping of charges in said charge trapping unit, wherein programming said memory element further comprises activating a fuse coupled to said memory element in response to said changing said threshold voltage, for activating said memory element.

39. The method of claim 38, further comprising:
   grounding a gate terminal of said access transistor;
   grounding a substrate of said threshold voltage; and
   providing a high voltage upon a drain terminal of said access transistor to perform trapping of charges into an overlap region of a region associated with said drain terminal.

40. The method of claim 38, further comprising:
   sensing a first conduction level associated with a first memory element of said memory device;
   sensing a second conduction level associated with a second memory element of said memory device; and
   comparing said first and second conduction levels to determine whether at least one of said first memory element and said second memory element is active.

41. The method of claim 40, further comprising activating said first memory element by modifying a level of a threshold associated with said first memory element.

42. The method of claim 40, further comprising de-activating said second memory element by modifying a level of a threshold associated with said second memory element.

43. The method of claim 38, further comprising modifying said threshold voltage by an increase of about 100 millivolts.

44. The method of claim 38, further comprising modifying said threshold voltage by an increase of about 200 millivolts.

45. An apparatus, comprising:
   means for programming a memory element in a memory device by controlling a threshold voltage associated with said memory device, means for controlling said threshold voltage comprising means for controlling the threshold voltage of an access transistor by trapping charges in a charge trapping area of said access transistor, wherein a threshold voltage of said access transistor is modified upon trapping of charges in said charge trapping unit, wherein means for programming said memory element further comprises means for activating a fuse coupled to said memory element in response to said changing said threshold voltage, for activating said memory element.

* * * * *